US011408092B2

(12) United States Patent
Qu et al.

(10) Patent No.: US 11,408,092 B2
(45) Date of Patent: Aug. 9, 2022

(54) METHOD FOR HEAT-TREATING SILICON SINGLE CRYSTAL WAFER

(71) Applicant: SHIN-ETSU HANDOTAI CO., LTD., Tokyo (JP)

(72) Inventors: Wei Feng Qu, Takasaki (JP); Ken Sunakawa, Annaka (JP); Tadashi Nakasugi, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/962,269

(22) PCT Filed: Dec. 25, 2018

(86) PCT No.: PCT/JP2018/047446
§ 371 (c)(1),
(2) Date: Jul. 15, 2020

(87) PCT Pub. No.: WO2019/159539
PCT Pub. Date: Aug. 22, 2019

(65) Prior Publication Data
US 2021/0062366 A1 Mar. 4, 2021

(30) Foreign Application Priority Data
Feb. 16, 2018 (JP) .............................. JP2018-026465

(51) Int. Cl.
*C30B 1/02* (2006.01)
*C30B 33/02* (2006.01)
*C30B 29/06* (2006.01)

(52) U.S. Cl.
CPC ................ *C30B 33/02* (2013.01); *C30B 1/02* (2013.01); *C30B 29/06* (2013.01)

(58) Field of Classification Search
CPC ............ C30B 1/02; C30B 33/02; C30B 29/06
See application file for complete search history.

(56) References Cited

U.S. PATENT DOCUMENTS

2009/0000535 A1  1/2009 Ebara
2009/0007839 A1* 1/2009 Ebara .................... C30B 15/203
117/2

(Continued)

FOREIGN PATENT DOCUMENTS

JP    2007-194232 A    8/2007
JP    2009-218620 A    9/2009

(Continued)

OTHER PUBLICATIONS

Mar. 12, 2019 International Search Report issued in International Patent Application No. PCT/JP2018/047446.

*Primary Examiner* — Robert M Kunemund
(74) *Attorney, Agent, or Firm* — Oliff PLC

(57) ABSTRACT

A method for heat-treating a silicon single crystal wafer to control a BMD density thereof to achieve a predetermined BMD density by performing an RTA heat treatment on a silicon single crystal wafer composed of an Nv region in a nitriding atmosphere, and then performing a second heat treatment, the method including: formulating a relational equation for a relation between BMD density and RTA temperature in advance; and determining an RTA temperature for achieving the predetermined BMD density according to the relational equation. Consequently, a method for heat-treating a silicon single crystal wafer for manufacturing an annealed wafer or an epitaxial wafer each having defect-free surface and a predetermined BMD density in a bulk portion thereof.

4 Claims, 1 Drawing Sheet

(56) References Cited

U.S. PATENT DOCUMENTS

| | | | |
|---|---|---|---|
| 2014/0044945 A1 | 2/2014 | Mueller et al. | |
| 2017/0253995 A1* | 9/2017 | Qu | H01L 21/3225 |
| 2018/0247830 A1* | 8/2018 | Suzuki | H01L 21/26 |

FOREIGN PATENT DOCUMENTS

| | | |
|---|---|---|
| JP | 2011-114119 A | 6/2011 |
| JP | 2011-243923 A | 12/2011 |
| JP | 2013-232668 A | 11/2013 |
| JP | 2014-034513 A | 2/2014 |
| WO | 2016/084287 A1 | 6/2016 |

* cited by examiner

[FIG. 1]
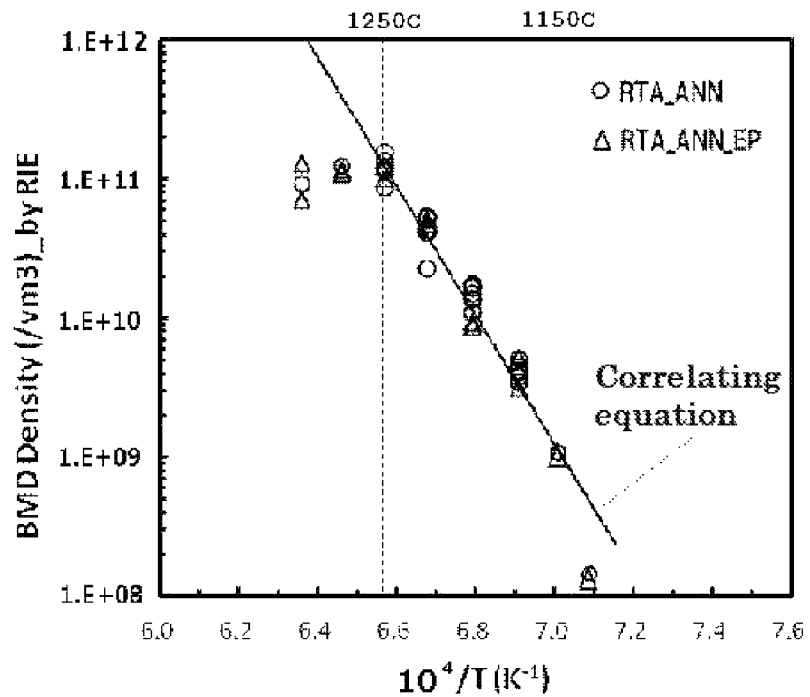
[FIG. 2]
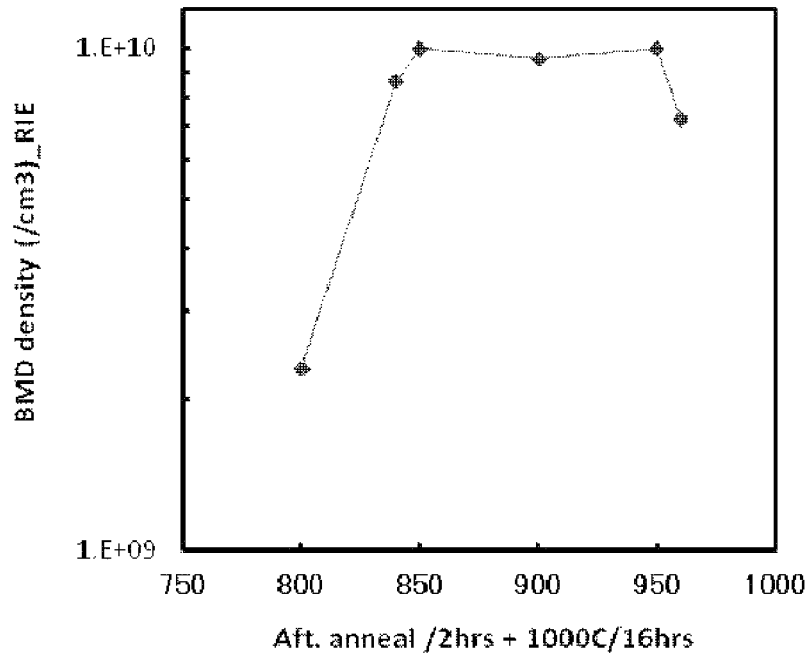

METHOD FOR HEAT-TREATING SILICON SINGLE CRYSTAL WAFER

TECHNICAL FIELD

The present invention relates to a method for heat-treating a silicon single crystal wafer.

BACKGROUND ART

A method for manufacturing an annealed wafer or an epitaxial wafer provided with gettering capability in a bulk portion thereof has been conventionally conducted by performing an RTA treatment on a defect-free wafer in a nitriding atmosphere to implant vacancies into the wafer, and then performing a heat treatment to form a DZ layer in the surface thereof while forming BMDs inside the wafer.

For example, Patent Document 1 discloses performing RTA at a temperature of 1150° C. to 1250° C. on a nitrogen-doped wafer having a perfect region that does not contain an OSF region, and then performing a precipitation treatment by heat-treating the silicon wafer at a temperature lower than the temperature of the RTA heat treatment to form a defect-free layer in the surface layer while precipitating oxygen in vacancies inside the wafer.

In addition, Patent Document 2 discloses newly forming vacancies in a wafer by RTA in an ammonia atmosphere, and then performing a heat treatment for forming oxide precipitates in the wafer.

Patent Document 3 discloses performing RTA in a gas atmosphere with a vacancy-implanting effect at 1000 to 1250° C., and then performing a heat treatment at 600° C. to 1150° C. for 0.25 to 24 hours to control vacancy-density distribution in a thickness direction of the wafer.

However, the object of these heat-treatment methods is to control a BMD distribution in a thickness direction of a wafer to a desired BMD distribution, but to control BMD density is not considered.

CITATION LIST

Patent Literature

Patent Document 1: Japanese Unexamined Patent Application Publication No. 2009-218620
Patent Document 2: Japanese Unexamined Patent Application Publication No. 2011-243923
Patent Document 3: Japanese Unexamined Patent Application Publication No. 2013-232668

SUMMARY OF INVENTION

Technical Problem

The present invention has been made in view of the above circumstance, and an object of the present invention is to provide a method for heat-treating a silicon single crystal wafer for manufacturing an annealed wafer or an epitaxial wafer each having defect-free surface and a predetermined BMD density in a bulk portion thereof.

Solution to Problem

To achieve the object, the present invention provides a method for heat-treating a silicon single crystal wafer to control a BMD density thereof to achieve a predetermined BMD density by performing an RTA heat treatment on a silicon single crystal wafer composed of an Nv region in a nitriding atmosphere, and then performing a second heat treatment, the method comprising: formulating a relational equation for a relation between BMD density and RTA temperature in advance; and determining an RTA temperature for achieving the predetermined BMD density according to the relational equation.

In this manner, by performing an RTA heat treatment on a silicon single crystal having an Nv region in a nitriding atmosphere, a DZ layer can be formed in the surface, and vacancies can be implanted in the wafer efficiently in addition to vacancies that are originally present in the silicon single crystal wafer.

Solid solubility of vacancies in an RTA heat treatment is influenced by temperature and atmosphere. In this event, by employing a nitriding atmosphere as a heat treatment atmosphere, the solid solubility of vacancies becomes higher even at the same RTA temperature, and precipitation can be promoted.

In the present invention, samples are first prepared with RTA temperatures varied in a range in which vacancies can be implanted in the silicon single crystal wafers (for example, 1150° C. to 1250° C.), and then BMDs are formed in the silicon single crystal wafers by performing a second heat treatment under predetermined conditions to determine a relation between RTA temperature and BMD density in advance.

In the present invention, after an RTA treatment is performed in a nitriding atmosphere to implant vacancies, the subsequent second heat treatment is performed to proceed reaction between the vacancies (V) and oxygen in the silicon single crystal (Oi) to grow oxide precipitate nuclei (composites such as V+Oi→VO and VO+Oi→VO$_2$) formed by the reaction. It has been found that when stable BMDs are formed through these treatments, a predetermined relational equation between BMD density and RTA temperature can be achieved. Using this relational equation, a BMD density can be predicted from the RTA temperature, or an RTA temperature for controlling the BMD density to a predetermined BMD density can be determined.

The second heat treatment in the present invention is preferably performed under conditions within ranges of 850 to 950° C. and 2 hours or more and less than 32 hours.

When the second heat treatment is within the above temperature range, precipitate nuclei can be grown efficiently, so that stable BMDs can be formed with a heat-treatment time of 2 hours or more. In this event, the upper limit of the heat-treatment time is preferably set to less than 32 hours in view of heat treatment cost.

In addition, when the heat-treatment temperature is set to 850° C. or more, precipitate nuclei can be grown efficiently. When the heat-treatment temperature is set to 950° C. or less, precipitate nuclei do not become annihilated, so that precipitate nuclei can be grown efficiently.

The heat treatment atmosphere in this event can be for example, an argon or oxygen atmosphere.

Furthermore, the nitriding atmosphere in the RTA heat treatment is preferably an atmosphere containing ammonia, for example, a mixed atmosphere of ammonia and argon.

In such an atmosphere, vacancies can be implanted in the silicon single crystal wafer efficiently.

It has been found that when a second heat treatment for growing and stabilizing precipitate nuclei is performed after performing RTA in such an ammonia-containing atmosphere, the relational equation of BMD density $(/cm^3) = 3 \times 10^{40} \exp(-8.86 \text{ eV}/kT)$ (here, $k$: Boltzmann constant, $T$: RTA temperature (K))

holds where the BMD density is within a range of $1\times10^9$ to $1\times10^{11}/cm^3$.

Therefore, using this relational equation, a BMD density can be estimated from the RTA temperature, or an RTA temperature for achieving a desired BMD density can be determined.

The above relational equation is for a case when RTA is performed in an ammonia-containing atmosphere. When an RTA heat treatment is to be performed in a different nitriding atmosphere, for example nitrogen atmosphere, samples are prepared with varied RTA temperatures in advance, stable BMDs are formed in the subsequent second heat treatment, and then a relational equation between the RTA temperatures and the BMD densities is formulated.

In addition, the RTA heat treatment in the present invention is preferably performed for a heat-treatment time of 1 second or more and less than 10 seconds.

When an RTA heat treatment is performed, a large number of vacancies are generated and react with the oxygen in the silicon single crystal substrate to form composites such as $VO_2$, and oxygen precipitation is promoted by the subsequent second heat treatment.

In this event, the generated amount of vacancies depends on RTA temperature, and does not depend on RTA time. Therefore, any heat-treatment time is sufficient if the RTA temperature becomes stable, and when the heat-treatment time is 1 second or more, the relational equation of the present invention can be achieved.

The upper limit of the heat-treatment time is not particularly limited, but is preferably less than 10 seconds, considering heat treatment cost.

Furthermore, the silicon single crystal wafer in the present invention preferably has an oxygen concentration of 13 ppma (JEIDA) or more and less than 17 ppma (JEIDA).

When the oxygen concentration is within the above range, oxide precipitate nuclei can be formed in the RTA heat treatment with certainty, and the relation between BMD density and RTA temperature can be obtained with certainty.

In this event, when the oxygen concentration is 13 ppma or more, it becomes easy to grow precipitate nuclei to a critical size in the RTA heat treatment.

The relational equation of BMD density and RTA temperature of the present invention also holds when the oxygen concentration is 17 ppma or more, but to prevent problems with device characteristics such as electric characteristics from occurring, the oxygen concentration is preferably less than 17 ppma.

Advantageous Effects of Invention

As described above, the inventive method for heat-treating a silicon single crystal wafer makes it possible to manufacture an annealed wafer or an epitaxial wafer that have defect-free surface and a predetermined BMD density in a bulk portion thereof simply and with precision in accordance with a relational equation of BMD density and RTA temperature formulated beforehand.

BRIEF DESCRIPTION OF DRAWINGS

FIG. 1 is a graph showing a relational equation of BMD density and RTA temperature determined in the present invention.

FIG. 2 is a graph which shows that the relational equation of the present invention holds.

DESCRIPTION OF EMBODIMENTS

As described above, it has been conventional to perform an RTA heat treatment on a wafer, and then further perform a heat treatment for growing precipitate nuclei as a second heat treatment so as to form a DZ layer in the surface of the wafer and provide a desired BMD distribution in a bulk portion of the wafer.

The present inventors have earnestly studied the above problem, and found that a predetermined relational equation between BMD density and RTA temperature can be achieved when an RTA treatment is performed in a nitriding atmosphere to implant vacancies, and then oxide precipitate nuclei formed by reaction of the vacancies and oxygen in the silicon single crystal are grown and stable BMDs are formed by the subsequent heat treatment. Thus, the present inventors have found that using this relational equation, a BMD density can be predicted from the RTA temperature, or an RTA temperature for controlling the BMD density to a predetermined BMD density can be determined. These findings have led to the completion of the present invention.

That is, the present invention is a method for heat-treating a silicon single crystal wafer to control a BMD density thereof to achieve a predetermined BMD density by performing an RTA heat treatment on a silicon single crystal wafer composed of an Nv region in a nitriding atmosphere, and then performing a second heat treatment, the method comprising:

formulating a relational equation for a relation between BMD density and RTA temperature in advance; and determining an RTA temperature for achieving the predetermined BMD density according to the relational equation.

Hereinafter, the present invention will be described in detail, but the present invention is not limited thereto.

Note that the "RTA heat treatment" in the present invention is a rapid thermal annealing heat treatment, can be performed in a commercially available RTA heat treatment furnace, and is a heat treatment for implanting vacancies in a wafer and forming oxide precipitate nuclei by reaction with oxygen in the silicon single crystal. On the other hand, the "second heat treatment" is a heat treatment that is performed after the RTA heat treatment for growing and stabilizing the formed oxide precipitate nuclei.

In the present invention, firstly, a plurality of Nv-region silicon single crystal wafers (CW wafers: chemically etched wafers) are prepared, and after making the RTA temperature vary under a nitriding atmosphere, are processed into PW wafers (mirror-polished wafers). Then, the second heat treatment is performed for growing and stabilizing oxide precipitate nuclei, and the BMD density in the bulk of each silicon single crystal wafer is measured. Note that an Nv region is a neutral (N) region having no excess or deficiency of atoms where vacancies (vacancy) are dominant. Since vacancies are dominant, oxide precipitates easily occur in the region.

From a correlation between these BMD density and RTA temperature, a relational equation of BMD density and RTA temperature is then formulated.

In this event, the silicon single crystal wafer preferably has an oxygen concentration of 13 ppma (JEIDA) or more and less than 17 ppma (JEIDA), the RTA heat treatment is preferably performed for a heat-treatment time of 1 second or more and less than 10 seconds, and the second heat treatment is preferably performed under conditions of 850 to 950° C. and 2 hours or more and less than 32 hours.

Within the ranges of these conditions, a relational equation of BMD density and RTA temperature is suitably achieved.

For example, when the nitriding atmosphere is an ammonia-containing atmosphere (a mixed atmosphere of ammonia and argon), the relational equation of $$\text{BMD density } (/\text{cm}^3) = 3 \times 10^{40} \exp(-8.86 \text{ eV}/kT)$$

holds where the RTA temperature is within the range of 1150 to 1250° C. and the BMD density is within the range of $1 \times 10^9$ to $1 \times 10^{11}$ per $\text{cm}^3$.

Since this relational equation depends on the heat treatment atmosphere of the RTA, it is necessary to determine in advance a relational equation of BMD density and RTA temperature in the atmosphere of the RTA to be actually performed.

When the RTA temperature is within the range of 1150 to 1250° C., the BMD density becomes higher as the RTA temperature becomes higher. When the RTA temperature is higher than 1250° C., the BMD density shows a constant value or is inclined to decrease somewhat.

This is considered to be because, even when the equilibrium concentration of vacancies V become higher, the form of the precipitate nuclei during an RTA heat treatment process changes from $VO_2$ to $4VO_2$ in a higher temperature range, so that many Vs are consumed for forming precipitate nuclei.

In addition, in the heat treatment of the present invention, BMDs are formed in both a plate form and a polyhedron form, and the size is about 40 to 300 nm (diagonal length) in the case of a plate, and about 10 to 50 nm (diagonal length) in the case of a polyhedron.

In the above, a CW wafer is used for performing the RTA heat treatment in a nitriding atmosphere, and then the second heat treatment is performed after processing into a PW wafer. Nevertheless, when only the relation between the BMD density and the RTA temperature is required, it is possible to use a PW wafer for performing the RTA heat treatment, and then perform the second heat treatment.

Next, using the relational equation of RTA temperature and BMD density formulated in advance, the RTA temperature for achieving a predetermined BMD density is determined, or a BMD density is estimated from the RTA temperature.

For example, when RTA is performed in an ammonia-containing atmosphere, the BMD density to be controlled is set, and the RTA temperature is determined using the relational equation:

$$\text{BMD density } (/\text{cm}^3) = 3 \times 10^{40} \exp(-8.86 \text{ eV}/kT).$$

When manufacturing an annealed wafer having a predetermined BMD density, a silicon single crystal wafer composed of an Nv region is CW-processed, and RTA heat-treated under an ammonia-containing atmosphere at the temperature determined from the above relational equation for 1 second or more and less than 10 seconds to form oxide precipitate nuclei.

Next, after a nitride film formed on the surface is removed by PW-processing, the second heat treatment is performed at 850 to 950° C. for 2 to 32 hours to grow and stabilize the oxide precipitate nuclei.

The atmosphere in this second heat treatment may be an argon atmosphere or an oxygen atmosphere.

When the atmosphere in the second heat treatment is an oxygen atmosphere, cleaning with hydrofluoric acid or the like is necessary to remove an oxide film formed on the surface.

Furthermore, an epitaxial layer may be formed on the surface of the annealed wafer obtained in this manner to obtain an epitaxial wafer.

EXAMPLE

Hereinafter, the present invention will be specifically described with reference to Examples and Comparative Example, but the present invention is not limited thereto.

Example 1

In Example 1, the following wafers were prepared and heat treatments were performed under the following conditions.
(Silicon Single Crystal Wafers)
  Diameter: 300 mm
  Defect region: Nv region
  Oxygen concentration: 14 ppma, 16.3 ppma (2 levels)
(RTA Conditions)
  Temperature: 1125 to 1275° C.
  Time: 9 seconds
  Atmosphere: $NH_3+Ar$
(Second Heat Treatment Conditions)
  Temperature: 900° C.
  Time: 2 hours
  Atmosphere: Ar Polished wafers (PW) and epitaxial wafers (EPW) obtained from the above wafers were subjected to the above heat treatment. Then, a heat treatment for revealing BMDs was performed at 780° C., 3 hours ($O_2$)+1000° C., 2 hours (3% $O_2$+97% $N_2$), and the BMD density was measured by RIE method to determine the correlation between the BMD density and the RTA temperature.

In this event, the EPW used had an epitaxial layer with a thickness of 4 μm.

As a result, it was confirmed that the relational equation of $$\text{BMD density } (/\text{cm}^3) = 3 \times 10^{40} \exp(-8.86 \text{ eV}/kT)$$

holds when the RTA temperature is within the range of 1150 to 1250° C. FIG. 1 shows this correlating equation.

In the figure, RTA_ANN shows the heat treatment conditions of RTA+900° C./2 hrs on the PW, and RTA_ANN_EP shows the heat treatment conditions of RTA+900° C./2 hrs+4 μm EP on the EPW.

Next, to form BMDs with a density of $1.0 \times 10^{10}/\text{cm}^3$ in a silicon single crystal wafer with a diameter of 300 mm, a defect region of Nv region, and an oxygen concentration of 14 ppma, the RTA temperature was set to 1198° C. using the relational equation between the RTA temperature and the BMD density formulated in the above.

Next, a different wafer with the same quality as those used above was CW-processed, then an RTA heat treatment was performed with $NH_3+Ar$ atmosphere, 1198° C., and 9 seconds, and then a PW-process was performed.

Next, a second heat treatment was performed under the conditions of Ar atmosphere, 900° C., and 2 hours.

Then, a heat treatment for revealing BMDs was performed at 780° C., 3 hours ($O_2$)+1000° C., 2 hours (3% $O_2$+97% $N_2$), and the BMD density was measured by RIE method. As a result, the BMD density was $1.02 \times 10^{10}/\text{cm}^3$, and the target BMD density was achieved.

Example 2

In Example 2, the following wafers were prepared and heat treatments were performed under the following conditions.
(Silicon Single Crystal Wafers)
  Diameter: 300 mm Defect region: Nv region
Oxygen concentration: 14 ppma
(RTA Conditions)
  Temperature: 1200° C.
  Time: 9 seconds
  Atmosphere: $NH_3$+Ar
(Second Heat Treatment Conditions)
  Temperature: 800 to 1000° C.
  Time: 2 hours
  Atmosphere: Ar After performing the above heat treatment, a heat treatment for revealing BMDs was performed at 780° C., 3 hours ($O_2$)+1000° C., 2 hours (3% $O_2$+97% $N_2$), and the BMD density was measured by RIE method.

Since the BMD density determined from the correlating equation of the present invention was $1.13\times10^{10}$/cm$^3$, it was confirmed that the correlating equation between the RTA temperature and the BMD density holds when the second heat treatment is within the range of 850 to 950° C. The results are shown in FIG. 2.

Comparative Example 1

Except that the RTA temperature was set to 1100° C., the BMD density was measured under the same conditions as in Example 1 using a silicon single crystal wafer having the same quality as that of Example 1, that is, a diameter of 300 mm, a defect region of Nv region, and an oxygen concentration of 14 ppma, in order to control the BMD density to $1.0\times10^{10}$/cm$^3$ as in Example 1.

As a result, the BMD density was $1.1\times10^9$/cm$^3$, and the result deviated significantly from the target value.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for heat-treating a silicon single crystal wafer to control a BMD density thereof to achieve a predetermined BMD density by performing an RTA heat treatment on a silicon single crystal wafer composed of an Nv region in a nitriding atmosphere, and then performing a second heat treatment, the method comprising:
  formulating a relational equation for a relation between BMD density and RTA temperature in advance, the relational equation being determined under the same condition as the nitriding atmosphere; and
  determining an RTA temperature for achieving the predetermined BMD density according to the relational equation, wherein
  the second heat treatment is performed under conditions within ranges of 850 to 950° C. and 2 hours or more and less than 32 hours,
  the nitriding atmosphere is an atmosphere containing ammonia, and
  an RTA temperature at which a predetermined BMD density is achieved is determined by
    using BMD density (/cm$^3$)=$3\times10^{40}$ exp (−8.86 eV/kT) as the relational equation, and
    setting a control range of the predetermined BMD density to $1\times10^9$ to $1\times10^{11}$ /cm$^3$.

2. The method for heat-treating a silicon single crystal wafer according to claim 1, wherein the RTA heat treatment is performed for a heat-treatment time of 1 second or more and less than 10 seconds.

3. The method for heat-treating a silicon single crystal wafer according to claim 1, wherein the silicon single crystal wafer has an oxygen concentration of 13 ppma (JEIDA) or more and less than 17 ppma (JEIDA).

4. The method for heat-treating a silicon single crystal wafer according to claim 2, wherein the silicon single crystal wafer has an oxygen concentration of 13 ppma (JEIDA) or more and less than 17 ppma (JEIDA).

* * * * *